United States Patent
Bassi et al.

(10) Patent No.: US 6,266,251 B1
(45) Date of Patent: Jul. 24, 2001

(54) CAVITY-DOWN BALL GRID ARRAY MODULE

(75) Inventors: Luigi B. Bassi, Lodi; Stefano O. Oggioni, Milan, both of (IT)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/356,982

(22) Filed: Jul. 19, 1999

(30) Foreign Application Priority Data

Dec. 9, 1998 (GB) .................................................. 9826937

(51) Int. Cl.⁷ ...................................................... H05K 1/18
(52) U.S. Cl. .......................... 361/761; 361/764; 361/728; 361/736; 361/748; 257/783; 257/734; 257/737; 257/738; 174/255; 174/260
(58) Field of Search ..................................... 361/761, 764, 361/728, 736, 748; 257/783, 701, 734, 737, 738, 723, 778; 174/255, 260

(56) References Cited

U.S. PATENT DOCUMENTS

| | | | |
|---|---|---|---|
| 4,926,240 | | 5/1990 | Regione ................................ 361/783 |
| 5,012,386 | * | 4/1991 | McShane et al. ..................... 361/715 |
| 5,889,332 | * | 3/1999 | Lawson et al. ....................... 257/778 |
| 5,963,429 | * | 10/1999 | Chen ..................................... 361/764 |
| 6,020,637 | * | 2/2000 | Karnezos .............................. 257/738 |
| 6,069,027 | * | 5/2000 | Mertol et al. ......................... 438/118 |
| 6,081,997 | * | 7/2000 | Chia et al. .............................. 29/841 |
| 6,083,768 | * | 7/2000 | Jiang et al. ............................. 438/25 |
| 6,121,679 | * | 9/2000 | Luvara et al. ........................ 257/700 |
| 6,150,724 | * | 11/2000 | Wenzel et al. ........................ 257/777 |

FOREIGN PATENT DOCUMENTS

| | | | |
|---|---|---|---|
| 2 195 825 A | 4/1988 | (GB) | ............................. H01L/23/12 |
| 58 075 843 A | 5/1983 | (JP) | ............................... H01L/21/58 |
| 7-335912 A | 12/1995 | (JP) | ............................... H01L/29/84 |

* cited by examiner

Primary Examiner—Jeffrey Gaffin
Assistant Examiner—David Foster
(74) Attorney, Agent, or Firm—Lawrence R. Fraley

(57) ABSTRACT

A Plastic Ball Grid Array electronic package of the Cavity Down type particularly for use in high-frequency applications. In these packages the substrate has a cavity for receiving an active device (chip), which is usually attached to the substrate by means of the layer of glue. Due to the small dimensions of the chip and the gap between the chip and the cavity walls, it is extremely difficult to control the right quantity of glue in the dispensing operations. When the chip is pressed against the bottom of the cavity the glue may overflow and damage the circuits. According to the present invention, a secondary cavity is created inside the primary one and acts as a reservoir for the glue in excess.

10 Claims, 2 Drawing Sheets

CAVITY-DOWN BALL GRID ARRAY MODULE

TECHNICAL FIELD

The present invention relates to Ball Grid Array (BGA) electronic modules and more particularly to the manufacturing of cavity-down ball grid array modules.

BACKGROUND ART

A recent development of technology has introduced the use of Printed Circuit Board (PCB) laminates as substrates for the manufacturing of electronic modules which can be of the Single Chip Module (SCM) type or Multi Chip Module (MCM) type. These modules are provided with a plurality of conductive pads for electrical connection with electronic circuits (such as mother boards, back planes, application boards). The electrical connection is achieved by little spherical portions of solder alloy which give the name of Ball Grid Array (BGA) to this kind of electronic module. Usually such modules use PCB laminates made of organic material. These modules are usually called Plastic Ball Grid Arrays. The definition "Plastic" indicates the flexible nature of the PCB as opposed to a ceramic substrate. Another example of a BGA module is the Tape BGA (TBGA) which uses a tape of organic material as substrate instead of the laminate. The Plastic BGA are also called "organic": the definition derives from the epoxies resin compounds (organic chemistry) used to build these laminates.

One possible Plastic BCA module is the Cavity Down package as shown in FIG. 1. The main difference between the Cavity Down module and a more usual chip-up package, is that the active element 101 is attached on the lower side of the module, on the same side of the solder balls 107 through which the module will be attached to the mother board 105. The active device (or chip) 101 is positioned in a sort of cavity of the organic substrate 113, which completely surrounds the active element 101. This arrangement presents some advantages with respect to the Chip-Up PBGA module. One of the advantages is the reduced thickness of the resulting package, since the chip is "contained" in the substrate. Furthermore, these modules provide a better heat dissipation, because the active element is usually attached to a metal stiffener 103 which constitutes the top face of the module and also acts as heat dissipator. Usually these packages use wire bonding 109 to connect the active device with the circuits on the substrate. Cavity-down packages are very effective to optimise high performance Silicon, Silicon Germanium or GaAs devices. More generally, all those applications which work in the high frequency range, are preferably realised in cavity packages because this electronic package has several advantages for the applications and for the devices performance.

In cavity-down packages the active device (or chip) is usually inserted in the cavity and attached to the bottom of the cavity by means of a glue layer. As shown in FIGS. 2A–2C, a dot of glue 201 is dropped on the bottom of a cavity and then an active device is pressed on top of it, the glue spreads and covers the whole cavity floor. When all air gaps have been replaced by the glue, this starts to escape in the gap 111 that exists between the vertical walls of the chip and the cavity. If the device is not pressed against the cavity it can float over the glue, without providing the required parallelism or flatness. The chip needs to be completely parallel and flat with respect to the substrate surface in order to allow a correct wire bonding. Furthermore, the glue under the chip may not cover completely the area between the device and the metal cavity floor; this may allow the formation of bubbles in the following encapsulation operation and will definitively affect the thermal dispersion characteristic of the assembled device with a severe impact to the product's reliability.

Parallelism and narrow gaps are mandatory in cavity down packages for telecom and all the other high frequency applications where the working frequency of the device is above 1 GHz. Excessive wire bond length in these application is one of the major contributors to signal attenuation. For this reason it is important to keep the wire length to the minimum possible length. As an example, 1 mm of a 32 $\mu$m gold wire gives an inductance of approximately 1 nH; high frequency applications designers require a maximum inductance in the order of 0,6–0,8 nH. To achieve such low inductance values it is important to reduce as much as possible the gap 111 between the chip and the cavity package. This taking into consideration that the size of the component used in these applications is in the range of few mm, with a thickness of few tenths of a millimetre. According to a preferred embodiment of the present invention the gap between the chip and the cavity wall is about 0.1 mm. In any case it should not exceed 0.3 mm for acceptable inductance values.

Volume control of the dispensed glue dot is a very difficult aspect of the assembling operation; the glue dispensing operation faces some intrinsic limitations, such as the minimum needle diameter that is itself determined by the glue viscosity and rheology. Furthermore, the quantity of glue to he dispensed is in the order of one milligram (for a 4 mm =3 mm =0.2 mm chip) while the minimum dispensing quantity, using the most sophisticated volumetric head on automated equipment, is about 5 milligrams. This 5 milligrams limitation rules out active dispensing, while the alternative remains passive glue dispensing, but questionable repetitive results may be reached only with high capital investments.

As shown in FIGS. 2a–2c, when the device 101 is pushed down until it reaches the cavity floor 203, the glue is pushed up through the whole perimeter gap 111 between the chip and the packaging carrier. When the glue reaches the top surface of the active device it spreads over the bonding pads. The overflowing glue 207 makes the metallic bonding pads no longer available for electrical connections; at this point the package is irreparably damaged and, considering the high cost of these devices this may be a big waste of money.

The present invention has the object to provide a technique which alleviates the above drawbacks.

SUMMARY OF THE INVENTION

According to the present invention, we provide a substrate for the manufacturing of an electronic module, comprising: a first cavity for receiving an active device, the active device being attached by means of a glue layer and being electrically connected to the substrate by means of wire bonding; characterised in that it further comprises a second cavity defined within the first cavity, the second cavity having dimensions not exceeding the dimension of the active device.

Further, according to the present invention, we provide a Plastic Ball Grid Array module comprising a substrate, the substrate having a first cavity for receiving an active device, the active device being attached by means of a glue layer and being electrically connected to the substrate by means of wire bonding; characterised in that the substrate further comprises a second cavity defined within the first cavity, the second cavity having dimensions not exceeding the dimension of the active device.

Also, according to the present invention, we provide a method for manufacturing a cavity-down Ball Grid Array electronic package, the package comprising a substrate having a first cavity for receiving an active device, the active device being electrically connectable to the substrate by means of wire bonding; the method comprising the steps of: providing a second cavity, defined within the first cavity; placing a drop of glue on the bottom of the second cavity; placing the active device inside the first cavity and pressing the active device against the glue; the second cavity acting as a reservoir for the glue, and having dimensions not exceeding the dimensions of the active device.

BRIEF DESCRIPTION OF THE DRAWINGS

The above and other advantages of the present invention will be better understood with reference to the following figures, where.

According to a preferred embodiment of the present invention, a Cavity Down type BGA module with organic substrate is used.

DETAILED DESCRIPTION OF THE PREFERRED EMBODIMENT

Figure 1:
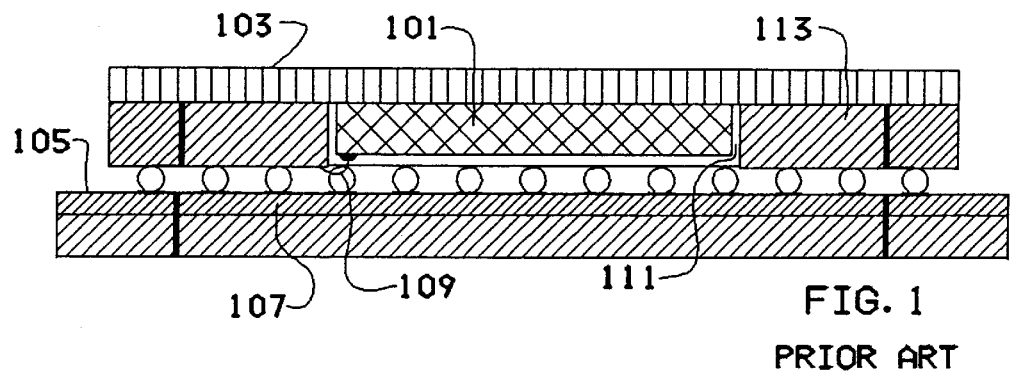
FIG. 1 is a schematic representation of a prior art BGA module of the cavity-down type.
Figure 2:
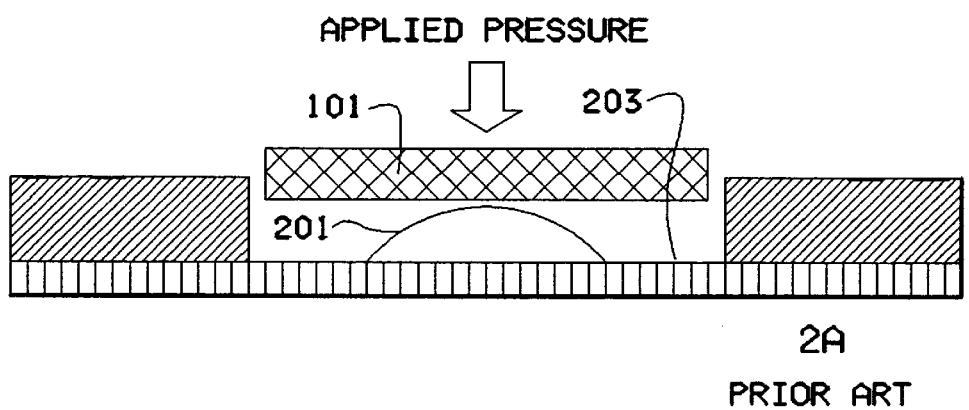
FIGS. 2a–2c is a schematic representation of the assembly operations of a prior art cavity-down BGA package.
Figure 2:
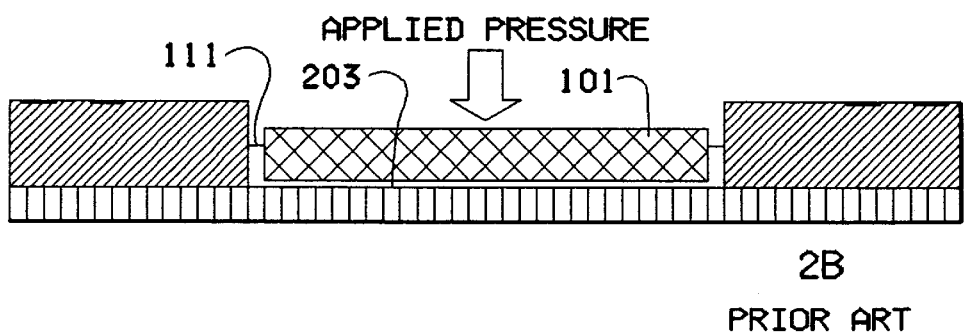
Figure 2:
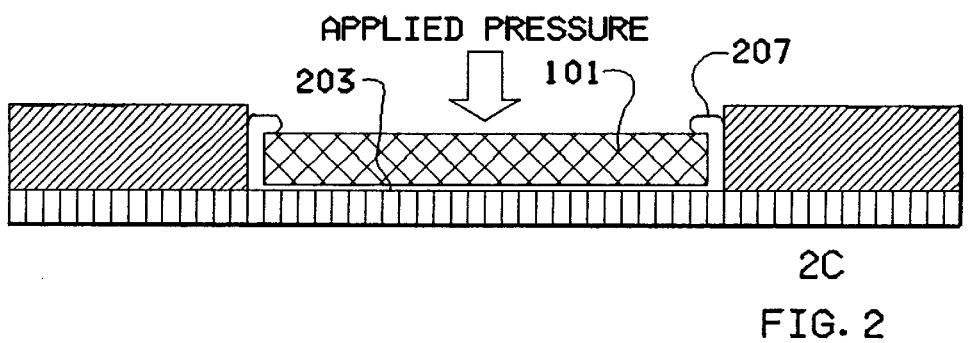
Figure 3:
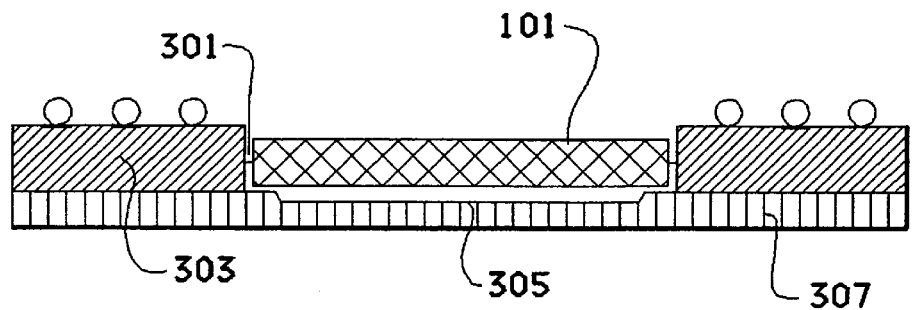
FIG. 3 is a schematic representation of a cavity-down BGA module according to a preferred embodiment of the present invention.

With reference to FIG. 3 a cavity-down BGA package according to a preferred embodiment of the present invention is described. The package has a substrate 303 (e.g an organic substrate) with a cavity to receive the active element 101. According to a preferred embodiment of the present invention the active element 101 is attached with a glue layer to a metal stiffener 307 which constitutes the bottom of the cavity. A secondary cavity 305 is created within the primary cavity. The secondary cavity 305 is obtained on the bottom of the primary cavity. As an example, according to a preferred embodiment of the present invention, the secondary cavity can be created by "digging" the metal stiffener. This can be done using a number of known methods, e.g. by drilling, etching, lamination, photo imaging processes or other mechanical, chemical procedures. According to a preferred embodiment of the present invention, the shape of this secondary cavity is round, but any other specific geometry may accommodate specific design requirements. The maximum diameter of the secondary cavity 305 is usually no larger than the smaller side of the device 101, so in a specific embodiment this will fit completely under the active device that is usually square or rectangular in shape. This secondary cavity acts as a reservoir for the dispensed glue, the primary cavity floor will act as a final mechanical stop to the depth of the active device inside the cavity package, while the reservoir will avoid excess glue material rising above the active device along the perimeter 301 of the cavity. Another important effect of the reservoir is to bring the volume of the dispensed glue dot within the capability of available dispensing heads (between 5 and 10 milligrams) so as to enable an automatic glue dispensing operation to be used within the manufacturing process.

This secondary cavity will maintain the whole thermal dissipation path of the device toward the metal heat sink embedded in the plastic cavity package. The mechanical depth control offered by the primary cavity floor allows the implementation of die attach operations with higher through put and low complexity so that automatic manufacturing processes can be used.

Figure 4:
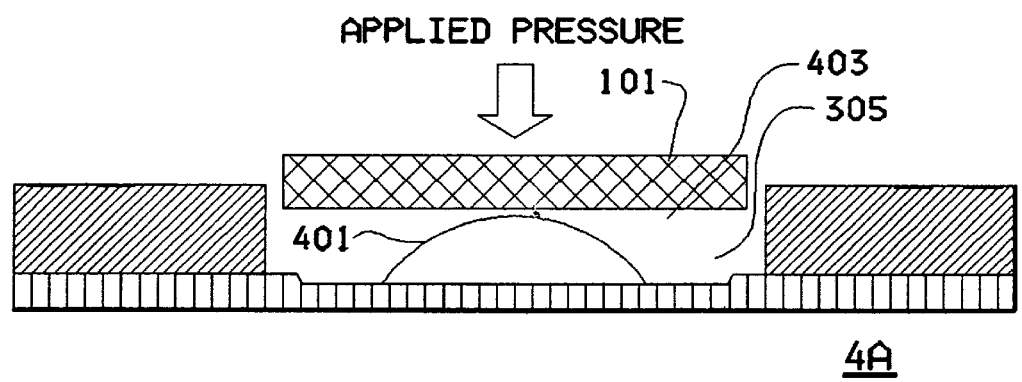
FIGS. 4a–4c is a schematic representation of the assembly operations of a cavity-down BGA package according to a preferred embodiment of the present invention.
Figure 4:
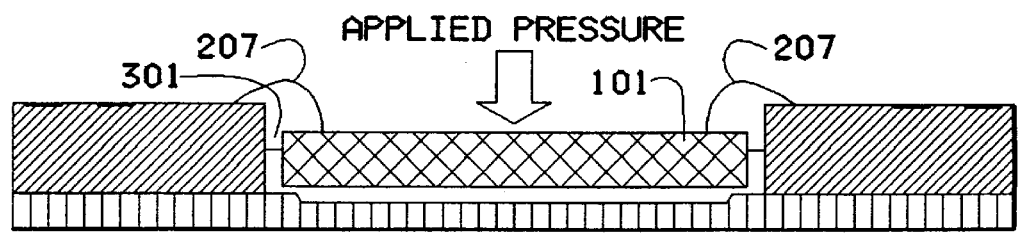
Figure 4:
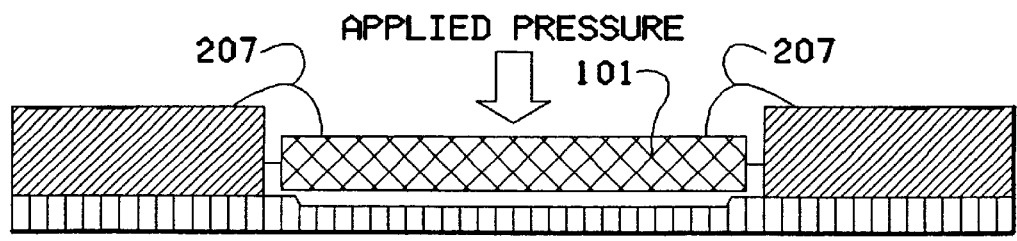

With reference to FIGS. 4a–4c the manufacturing process of a cavity down BGA package according to the preferred embodiment is shown. A glue drop 401 is deposited on the metal stiffener and a chip 101 is placed inside the cavity 403. A pressure is applied to the chip which is pushed towards the bottom of the cavity 403. The glue spreads all over the bottom of the cavity and tends to fill the lateral gap 301 between the chip 101 and the substrate. As mentioned above the gap 301 will be very narrow in high-frequency application to keep the wire bonding between the chip and the circuits on the substrate as short as possible. The additional cavity according to the present invention acts as a reservoir for the glue and prevents the glue from completely filling the gap 301 and overflowing the chip 101. The additional cavity provides enough room for the excessive glue. The volume of dispensed glue must be greater than the volume of the additional cavity, but not exceed the sum of volumes of the additional cavity and the gap around the chip.

Another advantage provided by the additional cavity is the increased metal surface offered by the cavity floor which is obtained in the metal stiffener 307. This increased metal surface provides a better thermal dissipation to the electronic package, which is a very desirable effect, particularly for high-frequency applications.

What is claimed is:

1. A substrate for the manufacturing of an electronic module, comprising:
   a first cavity for receiving an active device having a side dimension, the active device being attached by a glue layer and being electrically connectable to the substrate by wire bonding;
   characterised in that said substrate further comprises a second cavity defined within the first cavity under the active device, the second cavity having a first width dimension less than the side dimension of the active device.

2. The substrate of claim 1 wherein the maximum gap between the active element and the first cavity wall is less than 0.3 mm wide.

3. The substrate of claim 1 wherein the second cavity is positioned completely under the active device.

4. The substrate of claim 1 wherein the volume of the second cavity is greater than the volume of the glue minus the volume of the gap between the active element and the cavity walls.

5. A Ball Grid Array (BGA) module including the substrate of claim 4.

6. The BGA module of claim 5 wherein the substrate is an organic Printed Circuit Board (PCB).

7. The BGA module of claim 6, wherein said module is of the Cavity Down type.

8. The Cavity Down BGA module of claim 7 for use in high-frequency application, wherein the inductance caused by the wire bonding must be less than 0.6 nH.

9. A method for manufacturing a cavity-down Ball Grid Array electronic package, comprising the steps of:
   providing a substrate having a first cavity for receiving an active device having a side dimension, the active device being electrically connectable to the substrate by wire bonding;

providing a second cavity, defined within the first cavity under the active device;

placing a drop of glue on the bottom of the second cavity; and placing the active device inside the first cavity and pressing the active device against the glue, the second cavity acting as a reservoir for the glue, and having a first width dimension less than the side dimension of the active device.

10. The method of claim 9 wherein the volume of the second cavity is greater than the volume of the glue drop minus the volume of the gap between the active element and the cavity wall.

* * * * *